United States Patent
Yamamura (10) Patent No.: US 7,196,365 B2
(45) Date of Patent: Mar. 27, 2007

(54) SOLID-STATE IMAGING DEVICE, SOLID-STATE IMAGING APPARATUS AND METHODS FOR MANUFACTURING THE SAME

(75) Inventor: Ikuhiro Yamamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/423,139

(22) Filed: Apr. 25, 2003

(65) Prior Publication Data

US 2004/0000669 A1    Jan. 1, 2004

(30) Foreign Application Priority Data

May 1, 2002    (JP)    .............................. 2002-129780

(51) Int. Cl.
*H01L 31/062*    (2006.01)
(52) U.S. Cl. ...................... 257/292; 257/184; 257/187; 257/461; 257/506
(58) Field of Classification Search ...................... None
See application file for complete search history.

(56) References Cited

U.S. PATENT DOCUMENTS

| | | | |
|---|---|---|---|
| 6,249,055 B1 * | 6/2001 | Dubin | 257/758 |
| 6,274,917 B1 * | 8/2001 | Fan et al. | 257/432 |
| 6,316,814 B1 * | 11/2001 | Nagata et al. | 257/435 |
| 6,507,059 B2 * | 1/2003 | Chen et al. | 257/290 |
| 6,545,331 B1 * | 4/2003 | Miida | 257/431 |
| 6,599,835 B1 * | 7/2003 | Marathe et al. | 438/678 |

* cited by examiner

*Primary Examiner*—Wai-Sing Louie
(74) *Attorney, Agent, or Firm*—Robert J. Depke; Rockey, Depke, Lyons & Kitzinger LLC (57) ABSTRACT

To arrange diffusion-inhibitory films 5a, 5b, and 5c for inhibiting the diffusion of a wiring material absent in a region on or above a light receiving unit 2, the diffusion-inhibitory films 5a, 5b, and 5c formed on a region above the light receiving unit 2 are selectively removed. Alternatively, the diffusion-inhibitory films are arranged only on top surfaces of wirings 4a, 4b, and 4c, and only a passivation film 12 and interlayer insulating films 3a, 3b, and 3c are arranged in the region on or above the light receiving unit 2. Thus, with less interface between different insulation films and less reflection of incident light in an incident region, the incident light 13 highly efficiently passes through these insulating films and comes into the light receiving unit 2. The light receiving unit 2 can thereby receive a sufficient quantity of the incident light 13.

18 Claims, 12 Drawing Sheets

SOLID-STATE IMAGING DEVICE, SOLID-STATE IMAGING APPARATUS AND METHODS FOR MANUFACTURING THE SAME

This application claims priority to previously filed Japanese Patent Application No. P2002-129780, filed May 1, 2002, which is incorporated herein by reference.

FIELD OF THE INVENTION

The present invention relates to solid-state imaging devices and solid-state imaging apparatus in which incident light satisfactorily comes into a light receiving unit of, for example, a charge-coupled device (CCD) solid-state imaging apparatus, and to methods for manufacturing these devices and apparatus.

DESCRIPTION OF THE RELATED ART

As wiring structures for reducing the wiring size of wiring used in large-scale integrated circuits (LSIs), copper wiring processes have been increasingly developed. Such copper wiring can have a much smaller size than that (about 0.5 μm) of wiring formed according to conventional technologies and will replace most of conventional wiring structures in future fine wiring patterns of 0.13 μm or less, namely, in the 0.13-μm rule generation or later.

Most of copper wiring structures now being developed are formed using a dual damascene process. A typical sectional structure of such a copper wiring is shown in FIG. 8.

Figure 8:
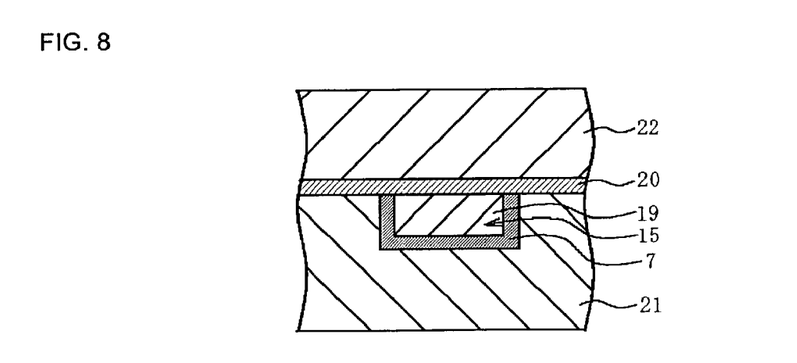
FIG. 8 a schematic diagram of a copper wiring formed by a dual damascene process.

With reference to the schematic cross section of FIG. 8, a device comprises, for example, a silicon substrate 21, a wiring trench 15 arranged in the silicon substrate 21, a barrier film 7 arranged on inner walls (bottom and side walls) of the wiring trench 15, a copper wiring 19 buried in the wiring trench 15 and formed by a damascene process, a diffusion-inhibitory film 20 arranged overall the silicon substrate 21 including the top of the copper wiring 19, and a $SiO_2$ film 22 arranged on the diffusion-inhibitory film 20.

According to the dual damascene process, the diffusion-inhibitory film must be formed on the inner walls of the wiring trench 15 and on the wiring after forming the copper wiring 19 so as to inhibit the diffusion of copper. A silicon nitride film is generally used as a material for the diffusion-inhibitory film.

However, when the resulting copper wiring is used in a solid-state imaging device, part of incident light is reflected due to the diffusion-inhibitory film used for the copper wiring to thereby reduce incoming light into a light receiving unit.

Figure 9:
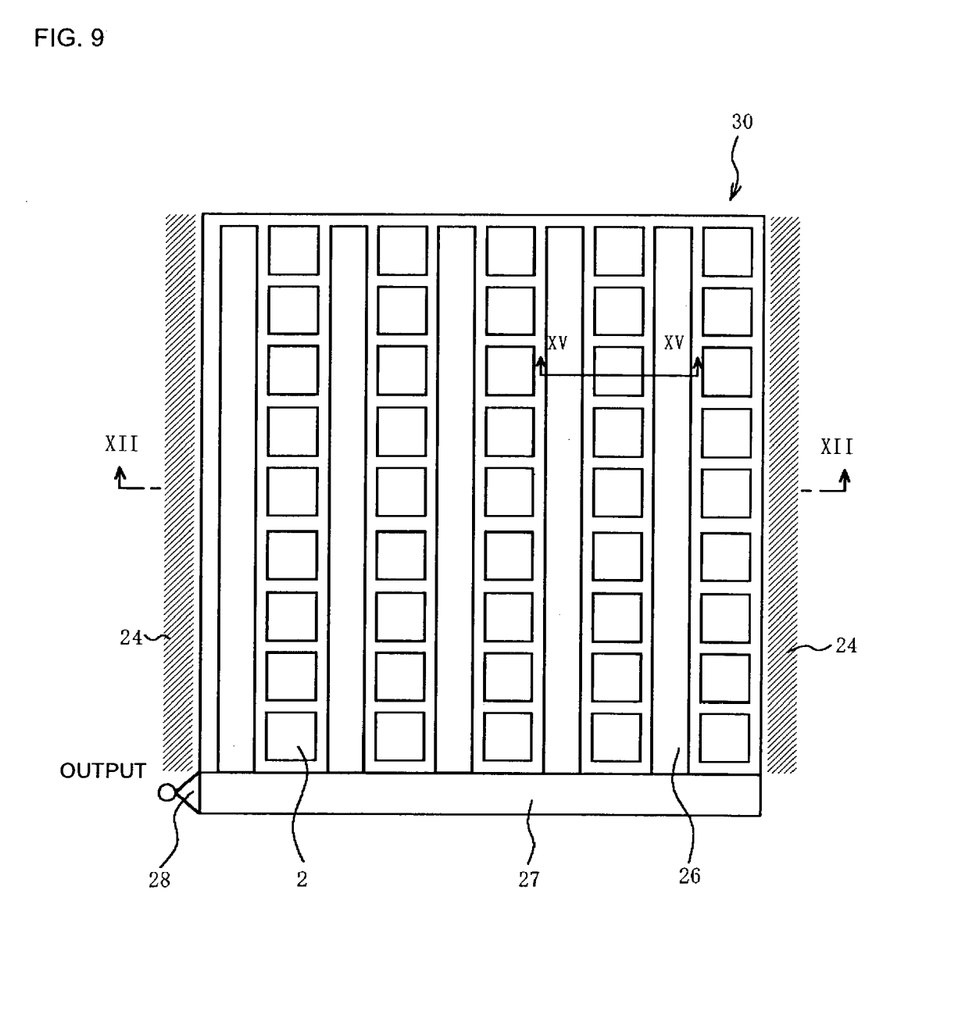
FIG. 9 is a schematic plan view of a solid-state imaging apparatus.

FIG. 9 is a schematic diagram showing a principal part of a solid-state imaging apparatus 30. The solid-state imaging apparatus 30 includes plural columns of vertical CCDs 26, each plural light receiving units (pixels) 2 arranged adjacent to each column of the vertical CCDs 26, and a circuit arranged on the periphery of the light receiving units 2. The circuit includes an amplifier 28 and a transfer unit comprising the vertical CCDs 26 and a horizontal CCD 27. Incident light undergoes photoelectric conversion in the light receiving units 2, and the circuit output light receiving signals of the incident light in the light receiving units 2.

Figure 10:
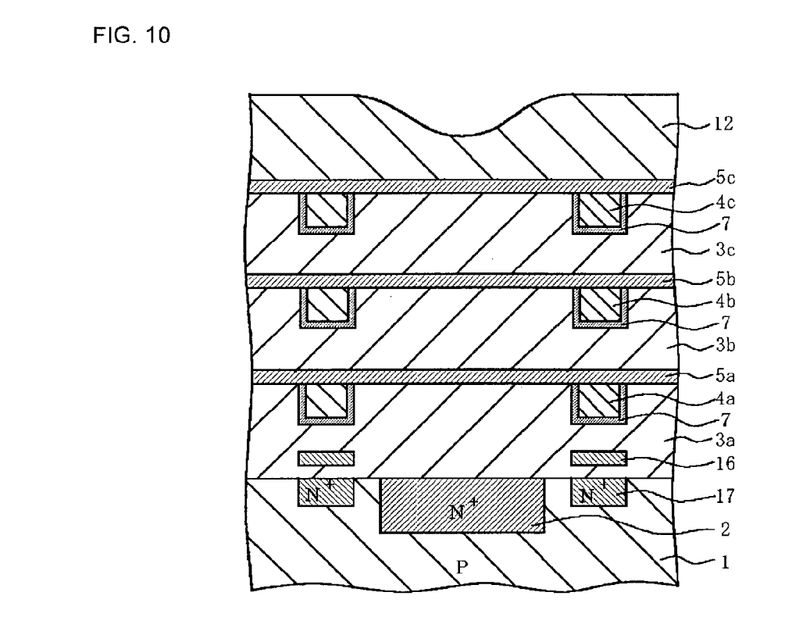
FIG. 10 is a schematic sectional view of a principal part of a conventional solid-state imaging device.

FIG. 10 is a schematic sectional view of a principal part of the solid-state imaging apparatus 30 including the light receiving unit 2 and the adjacent vertical CCD 26, taken along the line XV—XV in FIG. 9.

Figure 11:
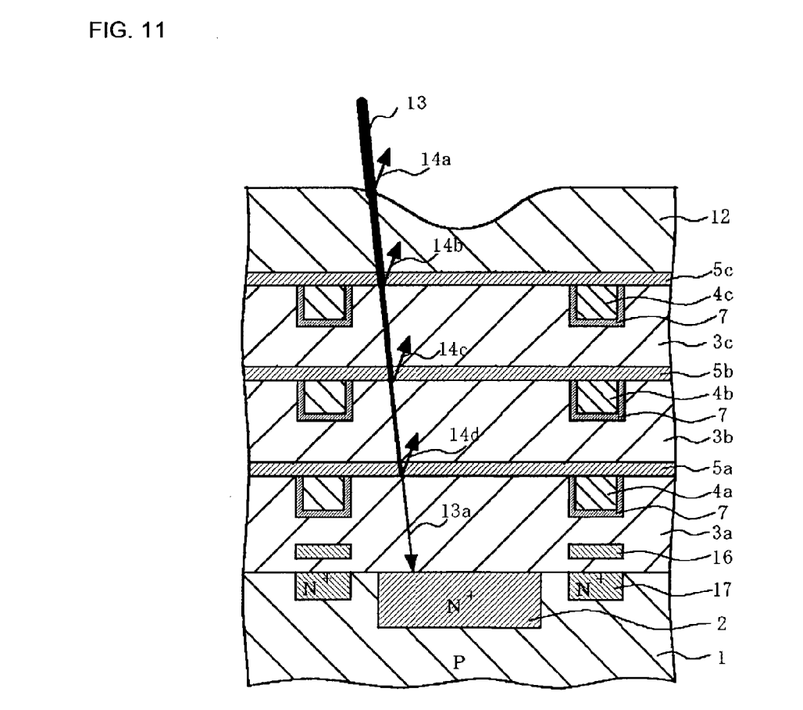
FIG. 11 is a schematic sectional view showing the reflection of incident light in the conventional solid-state imaging device of FIG. 10.

With reference to FIG. 10, the apparatus includes a substrate 1, the light receiving unit 2 and a channel region 17 arranged on the substrate 1, a first interlayer insulating film 3a including a gate electrode 16 arranged on the substrate 1, and a first wiring 4a arranged above the gate electrode 16. The first wiring 4a is formed by burying copper on a contact surface with the first interlayer insulating film 3a with the interposition of a barrier film 7. A first diffusion-inhibitory film 5a is arranged on the top of the fist wiring 4a including the first interlayer insulating film 3a. The apparatus further comprises a layer including a second interlayer insulating film 3b, a second wiring 4b, and a second diffusion-inhibitory film 5b, a layer including a third interlayer insulating film 3c, a third wiring 4c, and a third diffusion-inhibitory film 5c each arranged on the first diffusion-inhibitory film 5a, and a passivation film 12 covering the top of the layer just mentioned above. These layers each have the same configuration as that of the aforementioned components except the gate electrode 16. With reference to FIG. 11, the light receiving unit 2 receives incident light 13 from above.

Silicon nitride films used as the diffusion-inhibitory films 5a, 5b, and 5c have a larger refractive index (n=2.05) than that (n=1.46) of silicon oxide films used as the interlayer insulating films 3a, 3b, and 3c for the wiring 4a, 4b, and 4c. Accordingly, the incident light 13 is reflected at interfaces between the silicon oxide films and the silicon nitride films.

Specifically, with reference to FIG. 11, a part of the incident light 13 from above is sequentially reflected at the surface of the passivation film 12 and at the interfaces between the third, second, and first diffusion-inhibitory films 5c, 5b, and 5a and the interlayer insulating films 3c, 3b, and 3a, respectively. The incident light 13 thereby decays due to reflected light 14a, 14b, 14c, and 14d and comes into the light receiving unit 12 in a reduced quantity. When an organic insulation film or another film having a low dielectric constant is used as the interlayer insulating film, the silicon oxide film includes contaminated carbon and thereby has a refractive index further lager than that of the silicon nitride film, thus inviting serious problems.

Japanese Unexamined Patent Application Publication No. 5-198786 discloses a solid-state imaging device including an aluminum wiring and a movable ion inhibitory layer. The aluminum wiring is arranged in a region other than a light receiving unit so as to ensure a sufficient quantity of received light. The movable ion inhibitory layer serves to inhibit approaching of movable ions in a transparent resin layer covering a CCD solid-state imaging device to thereby avoid defective images. This structure is, however, not a structure having a diffusion-inhibitory film for a copper wiring formed by a damascene process, and the movable ion inhibitory layer for the surface transparent resin layer as disclosed in the publication is quite different from such a diffusion-inhibitory film for a copper wiring.

Japanese Unexamined Patent Application Publication No. 9-266295 discloses selective removal of a shielding film on or above a sensor region so as to ensure a sufficient sensor region of an imaging device and to prevent deteriorated sensitivity or uneven sensitivity. However, this structure is not a structure using a copper wiring formed by a damascene process and a diffusion-inhibitory film for the copper wiring.

The techniques disclosed in the publications (Japanese Unexamined Patent Application Publications No. 5-198786 and No. 9-266295) are not intended to a multilayer structure including a copper wiring with a diffusion-inhibitory film and thereby cannot solve the above problems.

Accordingly, an object of the present invention is to provide a solid-state imaging device and a solid-state imaging apparatus which enables incident light to satisfactorily come into a light receiving unit, even when materials having different refractive indexes of transmitting light are used for preventing the diffusion of a wiring material, and to provide methods for manufacturing the solid-state imaging device and the solid-state imaging apparatus.

SUMMARY OF THE INVENTION

The present invention provides, in a first aspect, a solid-state imaging device (hereinafter referred to as "solid-state imaging device of the present invention") including:
a light receiving unit;
a charge transfer unit arranged adjacent to the light receiving unit;
an interlayer insulating film;
a wiring arranged adjacent to the light receiving unit with the interposition of the interlayer insulating film; and
a diffusion-inhibitory film arranged on the wiring, the film serving for inhibiting the diffusion of a wiring material,
wherein the diffusion-inhibitory film is absent in a region on or above the light receiving unit.

Also, present invention relates to a solid-state imaging apparatus having a light receiving unit and a peripheral circuit unit formed on a substrate, comprising:
an interlayer insulating film formed above the substrate;
a wiring formed above the interlayer insulating film;
a diffusion-inhibitory film formed on the wire;
wherein the diffusion-inhibitory film is removed above the light receiving unit.

In the solid-state imaging device of the present invention, the diffusion-inhibitory film is arranged in a region other than the light receiving unit when viewed from above, and the diffusion-inhibitory film and thereby an interface (reflecting interface) between the diffusion-inhibitory film and an adjacent interlayer insulating film are not present in a region on or above the light receiving unit. Thus, the incident light is not reflected by the interface and efficiently comes into the light receiving unit, and the light receiving unit can receive a sufficient quantity of the incident light.

The present invention further provides, in a second aspect, a solid-state imaging apparatus (hereinafter referred to as "first solid-state imaging apparatus of the present invention") including a solid-state imaging device containing a light receiving unit and a charge transfer unit arranged adjacent to the light receiving unit; and a peripheral circuit unit arranged on the periphery of the solid-state imaging device, in which the solid-state imaging device is the solid-state imaging device of the present invention.

The first solid-state imaging apparatus of the present invention includes a solid-state imaging device having the same configuration as the solid-state imaging device of the present invention. Accordingly, the diffusion-inhibitory film and thereby an interface (reflecting interface) between the diffusion-inhibitory film and an adjacent interlayer insulating film is absent in a region on or above the light receiving unit. Thus, the incident light is not reflected by the interface and efficiently comes into the light receiving unit, and the light receiving unit can receive a sufficient quantity of the incident light and can photoelectrically convert the received light into a light receiving signal corresponding to the quantity of the received light and output the light receiving signal.

The present invention also provides another solid-state imaging apparatus (hereinafter referred to as "second solid-state imaging apparatus of the present invention"), including:
a solid-state imaging device including a light receiving unit, and a charge transfer unit arranged adjacent to the light receiving unit;
a peripheral circuit unit arranged on the periphery of the solid-state imaging device;
an interlayer insulating film;
a wiring arranged on the periphery of the solid-state imaging device with the interposition of the interlayer insulating film; and
a diffusion-inhibitory film for inhibiting the diffusion of a wiring material, the diffusion-inhibitory film being arranged on the wiring and being absent in a region on or above the light receiving unit of the solid-state imaging device.

The second solid-state imaging apparatus of the present invention has a peripheral circuit having the same configuration and can thereby exhibit the same advantages as the solid-state imaging device of the present invention. In addition, the peripheral circuit can include a low-resistance wiring and enables a peripheral driving circuit to be driven at a high speed.

The present invention also relates to a method for manufacturing the solid-state imaging device of the present invention (hereinafter referred to as "device manufacturing method of the present invention"), the method including the steps of:
forming the wiring on the interlayer insulating film;
applying a material for the diffusion-inhibitory film to regions including a region on the wiring or applying the material only to the region on the wiring;
selectively removing the material for the diffusion-inhibitory film or remaining the material as intact; and
forming the diffusion-inhibitory film so as to be absent in a region on or above the light receiving unit.

According to the device manufacturing method of the present invention, the material for the diffusion-inhibitory film for inhibiting the diffusion of a wiring material is selectively removed when the material for the diffusion-inhibitory film is applied onto regions including a region on the wiring formed on the interlayer insulating film. Alternatively, the diffusion-inhibitory film is allowed to remain as intact when the material for the diffusion-inhibitory film is applied only onto the wiring. Thus, the diffusion-inhibitory film is formed in a region other than the light receiving unit when viewed from above, and the diffusion-inhibitory film and thereby an interface between the diffusion-inhibitory film and an adjacent interlayer insulating film is absent in a region above the light receiving unit. Thus, the incident light is not reflected by the interface and efficiently comes into the light receiving unit, and the light receiving unit can receive a sufficient quantity of the incident light and can photoelectrically convert the received light into a light receiving signal corresponding to the quantity of received light and output the light receiving signal. The method can manufacture this solid-state imaging device with good reproducibility.

The present invention also relates to a method for manufacturing a solid-state imaging apparatus (hereinafter referred to as "first apparatus manufacturing method of the present invention"),
the solid-state imaging apparatus including:
a solid-state imaging device including a light receiving unit and a charge transfer unit arranged adjacent to the light receiving unit, the solid-state imaging device being the solid-state imaging device of the present invention; and a peripheral circuit unit arranged on the periphery of the solid-state imaging device, the method including the steps of:

forming the wiring on the interlayer insulating film;

applying a material for the diffusion-inhibitory film to regions including a region on the wiring or applying the material only to the region on the wiring;

selectively removing the material for the diffusion-inhibitory film or remaining the material as intact; and forming the diffusion-inhibitory film so as to be absent in a region on or above the light receiving unit.

The first apparatus manufacturing method of the present invention manufactures a solid-state imaging apparatus including a solid-state imaging device and a peripheral circuit, which solid-state imaging device has the same configuration as that of the solid-state imaging device of the present invention. Thus, the method can manufacture a solid-state imaging apparatus with good reproducibility, in which the light receiving unit of the solid-state imaging device can receive a sufficient quantity of the incident light and can output a light receiving signal photoelectrically converted corresponding to the quantity of the received light.

The present invention also relates to a method for manufacturing a solid-state imaging apparatus (hereinafter referred to as "second apparatus manufacturing method of the present invention"), the solid-state imaging apparatus including:

a solid-state imaging device including a light receiving unit and a charge transfer unit arranged adjacent to the light receiving unit;

a peripheral circuit unit arranged on the periphery of the solid-state imaging device;

an interlayer insulating film; and a wiring being arranged on the periphery of the solid-state imaging device with the interposition of the interlayer insulating film, and a diffusion-inhibitory film for inhibiting the diffusion of a wiring material, the diffusion-inhibitory film being arranged on the wiring and being absent in a region on or above the light receiving unit of the solid-state imaging device, the method including the steps of:

forming the wiring on the interlayer insulating film;

applying a material for the diffusion-inhibitory film to regions including a region on the wiring or applying the material only to the region on the wiring;

selectively removing the material for the diffusion-inhibitory film or remaining the material as intact; and forming the diffusion-inhibitory film so as to be absent in a region on or above the light receiving unit.

The second apparatus manufacturing method of the present invention manufactures a solid-state imaging apparatus including a peripheral circuit having the same configuration as the solid-state imaging device of the present invention. Thus, the method can manufacture a solid-state imaging apparatus with good reproducibility. In the resulting apparatus, the peripheral circuit can exhibit the same advantages as the solid-state imaging device of the present invention and can include a low-resistance wiring and enables a peripheral driving circuit to be driven at a high speed.

DESCRIPTION OF THE EMBODIMENTS

The present invention will be further illustrated with reference to preferred embodiments below.

In the solid-state imaging device, the first solid-state imaging apparatus, the second solid-state imaging apparatus, the device manufacturing method, the first apparatus manufacturing method, and the second apparatus manufacturing method of the present invention, the interlayer insulating film having the wiring buried therein may be arranged only in the region other than the light receiving unit or may be arranged also above the light receiving unit. In other words, the interlayer insulating film may be absent or present in a region above the light receiving unit. Due to the absence of the diffusion-inhibitory film in a region on or above the light receiving unit, the incident light can efficiently come into the light receiving unit even when an interlayer insulating film or another insulating film is present on or above the light receiving unit.

The diffusion-inhibitory film is preferably arranged only on the wiring buried in the interlayer insulating film. By this configuration, only the interlayer insulating film or other insulating films are present in a region above the light receiving unit, the incident light can efficiently pass through the interlayer insulating film and other layers and come into the light receiving unit, and the light receiving unit can thereby receive a sufficient quantity of the incident light.

A surface protecting film is preferably arranged at least in a region above the light receiving unit so as to protect the interlayer insulating film.

In these configurations, the device preferably has a plurality of the interlayer insulating film having the wiring buried therein. Thus, a wiring density per unit area can be increased and the resulting device and apparatus can be downsized.

To reduce the size of the wiring and to inhibit the dispersion of the wiring material to thereby further reduce the size, the wiring preferably comprises copper or a copper alloy, and the diffusion-inhibitory film preferably comprises, for example, silicon nitride, silicon carbide, or a tungsten-phosphorus material.

To inhibit the diffusion of the wiring material, the diffusion-inhibitory film is preferably also arranged on bottom and side surfaces of a recess formed in the interlayer insulating film for burying the wiring. A material for the diffusion-inhibitory film is preferably tantalum, tantalum nitride, or another tantalum material.

The multilayer structure of the insulating films and the structures of the wiring comprising copper or a copper alloy and of the diffusion-inhibitory film can be applied to the device, to the peripheral circuit, or to both of the solid-state imaging apparatus.

The preferred embodiments will be illustrated in further detail with reference to the attached drawings. The figures shown in the embodiments are cross sectional views taken along the line XV—XV in FIG. 9, as in the conventional equivalent (FIG. 10), and the same components as the conventional equivalent have the same reference numerals.

The term "device" as used herein means a part or component that has a certain function by itself, but also includes a functional unit having a certain function or an assembly of such functional units. The term "apparatus" means and includes an apparatus having a device and, for example, a peripheral circuit connected to the device and arranged on a common substrate, as well as an apparatus including a device and, for example, a separated peripheral circuit externally connected to the device.

First Embodiment

Figure 1:
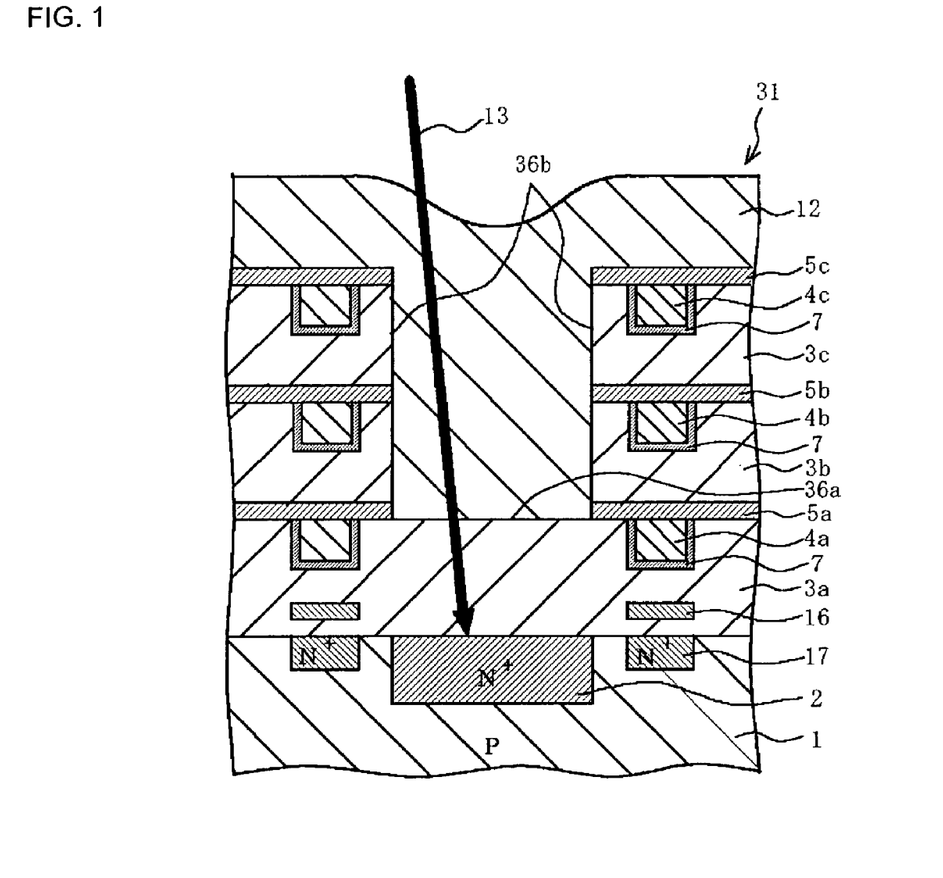
FIG. 1 is a schematic sectional view of a principal part of a solid-state imaging device according to a first embodiment of the present invention.

FIG. 1 is a schematic sectional view of a principal part of a solid-state imaging device 31 according to a first embodiment of the present invention. The solid-state imaging device 31 is for use in the first solid-state imaging apparatus of the present invention. In this device, silicon oxide films 3a, 3b, and 3c and silicon nitride films 5a, 5b, and 5c above a light receiving unit 2 are removed. The silicon oxide films 3a, 3b, and 3c serve as interlayer insulating films, and the silicon nitride films 5a, 5b, and 5c serve as diffusion-inhibitory films for copper wiring 4a, 4b, and 4c. Thus, the diffusion-inhibitory films 5a, 5b, and 5c in contact with the interlayer insulating films 3a, 3b, and 3c are absent above the light receiving unit 2.

As in the conventional equivalent shown in FIG. 10, the device according to the first embodiment includes a substrate 1, the light receiving unit 2 and a channel region 17 arranged on the substrate 1, a first interlayer insulating film 3a including a gate electrode 16 arranged on the substrate 1, and a first wiring 4a arranged above the gate electrode 16. The first wiring 4a is formed according to a damascene process by burying copper on a contact surface with the first interlayer insulating film 3a with the interposition of a barrier film 7. A first diffusion-inhibitory film 5a for inhibiting the diffusion of copper is arranged on the top of the fist wiring 4a including the first interlayer insulating film 3a. On the first diffusion-inhibitory film 5a are arranged a layer including a second interlayer insulating film 3b, a second wiring 4b, and a second diffusion-inhibitory film 5b, and a layer including a third interlayer insulating film 3c, a third wiring 4c, and a third diffusion-inhibitory film 5c, arranged in this order. These layers each have the same configuration as that of the aforementioned components except the gate electrode 16. Thereafter, the interlayer insulating films 3a, 3b, and 3c and the diffusion-inhibitory films 5a, 5b, and 5c in a region above the light receiving unit 2 are selectively removed, and a passivation film 12 comprising a silicon nitride film is applied to the entire surface of the device including the aforementioned region from which the films have been removed.

The diffusion-inhibitory films 5a, 5b, and 5c are absent in the region above the light receiving unit 2, and a region between the surface of the passivation film 12 and the light receiving unit 2 constitutes an incident region with less interfaces between different insulating films. As a result, incident light 13 can efficiently come from the passivation film 12 into the fist interlayer insulating film 3a with less reflection at reduced reflecting points, and the light receiving unit 2 can receive a sufficient quantity of the incident light 13.

The incident light 13 is partially reflected at an interface 36a between the passivation film 12 having a higher refractive index and the interlayer insulating film 3a having a lower refractive index, but the total amount of reflected incident light between the passivation film 12 and the light receiving unit 2 is small since only one interface of this type is present, and the decay of the incident light 13 is small. Consequently, the incident light 13 efficiently passes through the passivation film 12 and the first interlayer insulating film 3a and comes into the light receiving unit 2.

The incident light 13 in the present embodiment is also partially or totally reflected at side interfaces 36b between the passivation film 12 and the second and third interlayer insulating films 3b and 3c. A sufficient quantity of all the incident light is photoelectrically converted in the light receiving unit 2, and a circuit arranged on the periphery of the light receiving unit 2 outputs a signal of the input light. The circuit has a transfer unit, an amplifier, and other components.

FIGS. 2A, 2B, 2C, 2D, 2E, 2F, 2G, 2H and 2J are schematic diagrams of a manufacturing process for the solid-state imaging device 31.

Figure 2A:
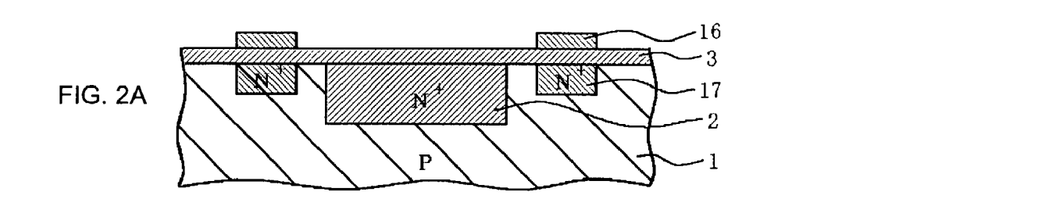
FIGS. 2A through 2J are schematic sectional views of a manufacturing process for the solid-state imaging device according the first embodiment.
Figure 2B:
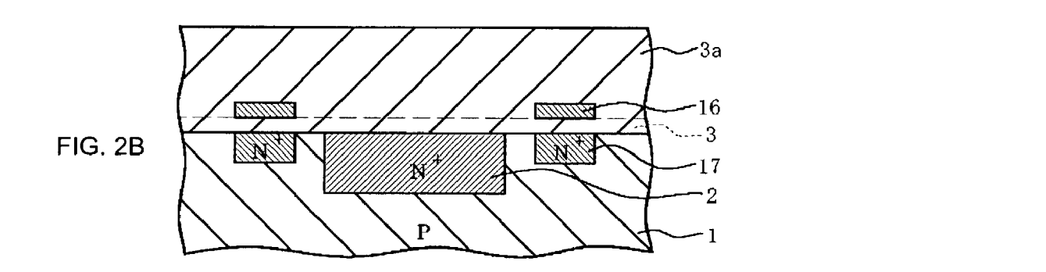

With reference to FIG. 2A, a silicon oxide film 3 as an insulative material is formed on a p-type silicon substrate 1 having a light receiving unit 2 comprising an $N^+$-type doped region and an $N^+$-type channel region 17, and a gate electrode 16 is formed on the silicon oxide film 3 above the channel region 17. With reference to FIG. 2B, a silicon oxide film comprising the same material as the silicone oxide film 3 is then formed so as to cover the silicone oxide film 3 inclusive of the gate electrode 16 to thereby yield a first interlayer insulating film 3a. The silicone oxide film may be formed from an organic coating film. This can be also applied to the other embodiments mentioned below.

In this configuration, an interface between the silicone oxide film 3 and the first interlayer insulating film 3a is present as shown by dashed lines in FIG. 2B. However, these two films comprise the same material and the interface therebetween is omitted in FIGS. 2C through 2J. A connection hole (not shown) is formed in the first interlayer insulating film 3a to thereby connect between the first interlayer insulating film 3a and the silicon substrate 1 using, for example, a tungsten plug.

Figure 2C:
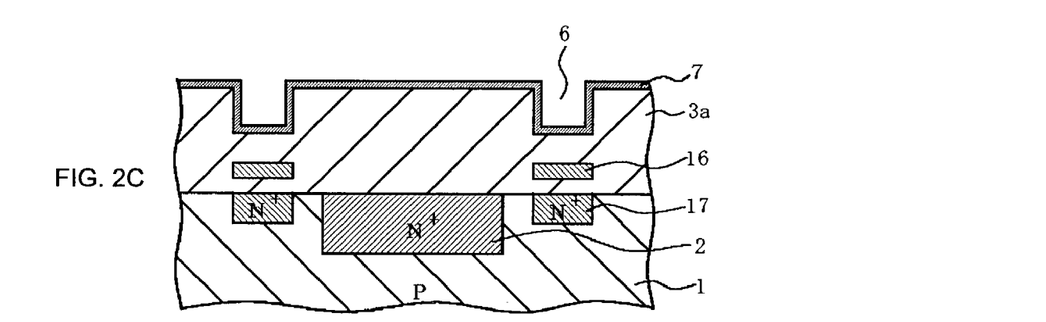

With reference to FIG. 2C, a wiring trench or recess 6 is formed in the first interlayer insulating film 3a above the gate electrode 16 by, for example, photolithography. A barrier film 7 is formed from, for example, tantalum or tantalum nitride on the wiring trench 6 and the first interlayer insulating film 3a by, for example, chemical vapor deposition (CVD) or sputtering.

Figure 2D:
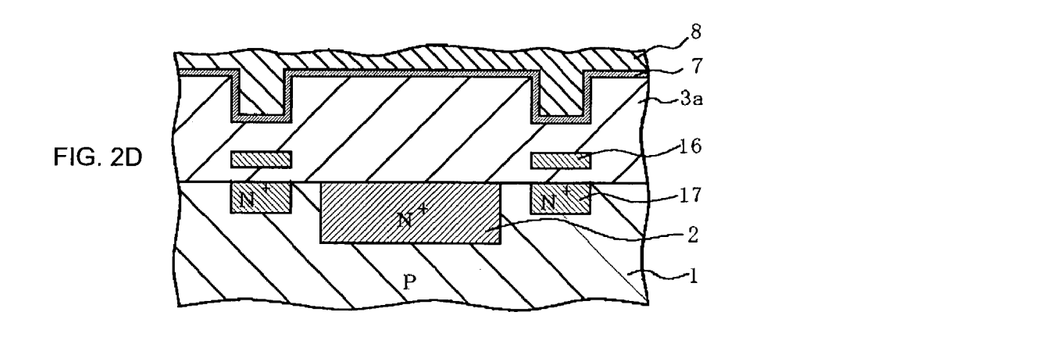

With reference to FIG. 2D, copper or an alloy thereof 8 is buried in the wiring trench 6 by a "single damascene process". As a result, the entire barrier film 7 serving as an electrode is coated with the copper or an alloy thereof (hereinafter representatively referred to as copper) 8.

Figure 2E:
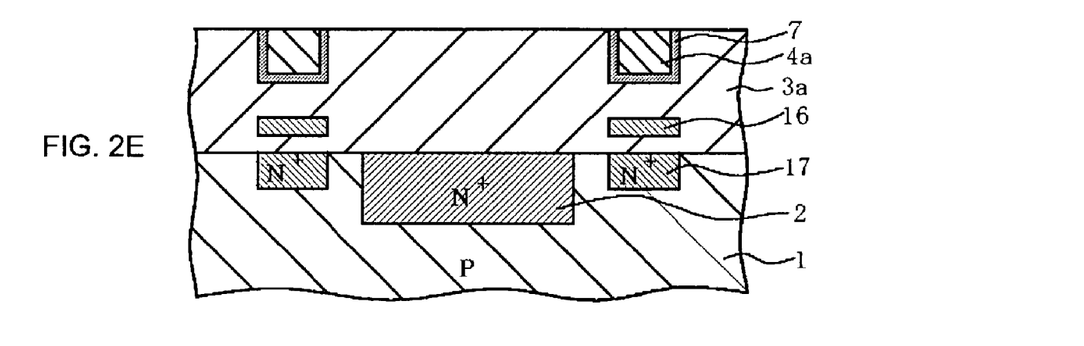

With reference to FIG. 2E, the buried copper 8 is smoothed by, for example, chemical-mechanical polishing (CMP) to thereby remove the barrier film 7 and the copper 8 in portions other than the wiring trench 6. Thus, a first wiring 4a is formed on the first interlayer insulating film 3a. As copper has a lower resistance than aluminum and can yield a wiring having a reduced size, the total area of the light receiving unit 2 can be increased with higher reliability of the wiring.

Figure 2F:
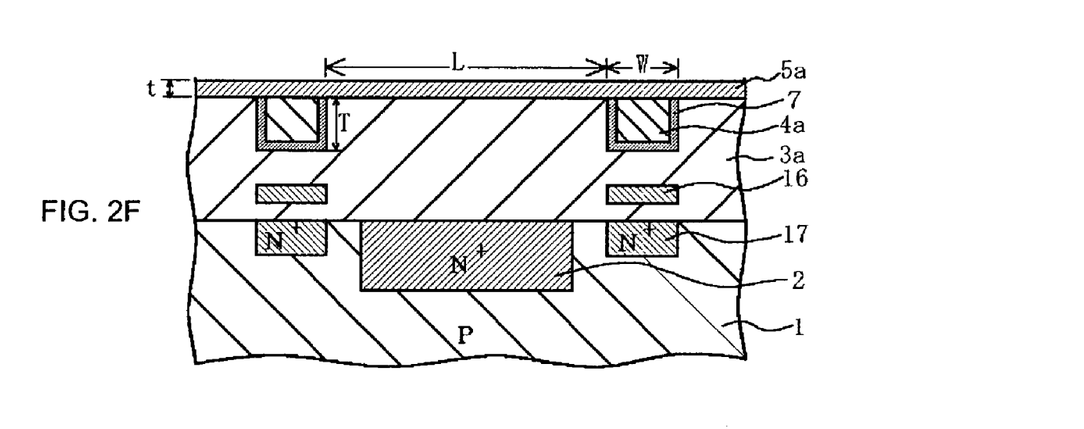

With reference to FIG. 2F, a silicon nitride film, for example, is formed on the first interlayer insulating film 3a and the first wiring 4a by CVD to thereby yield a first diffusion-inhibitory film 5a. This diffusion-inhibitory film 5a is for inhibiting the diffusion of the wiring material copper. As the material for the diffusion-inhibitory film, silicon carbide or a tungsten-phosphorus material can also be used.

The interval L between the first wirings 4a is 0.2 to 0.3 μm, the width W and thickness T of the first wiring 4a are about 0.2 μm and 2 to 300 nm, respectively, and the thickness t of the diffusion-inhibitory film 5a is about 50 nm. The second and third wirings and the second and third diffusion-inhibitory films mentioned below have similar dimensions.

Figure 2G:
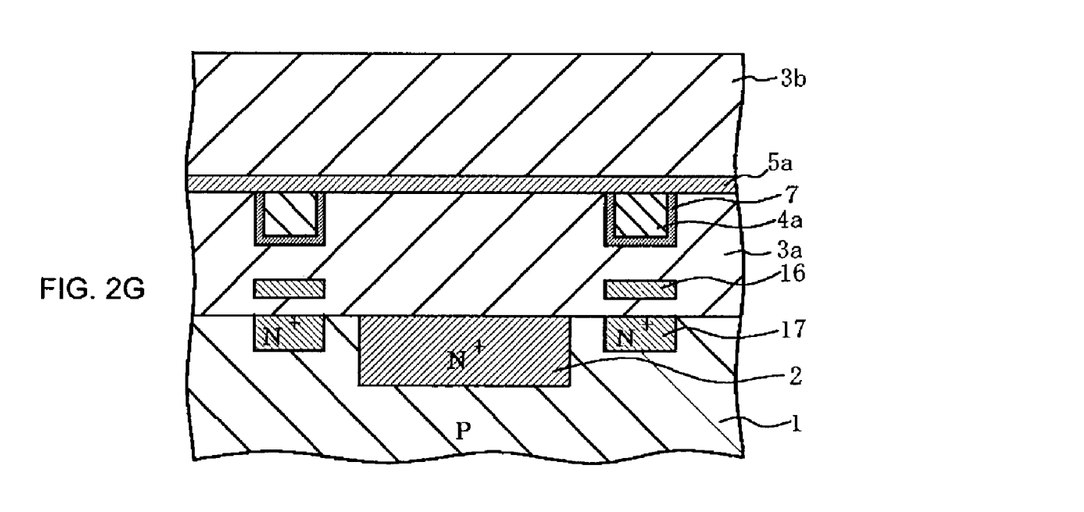
Figure 2H:
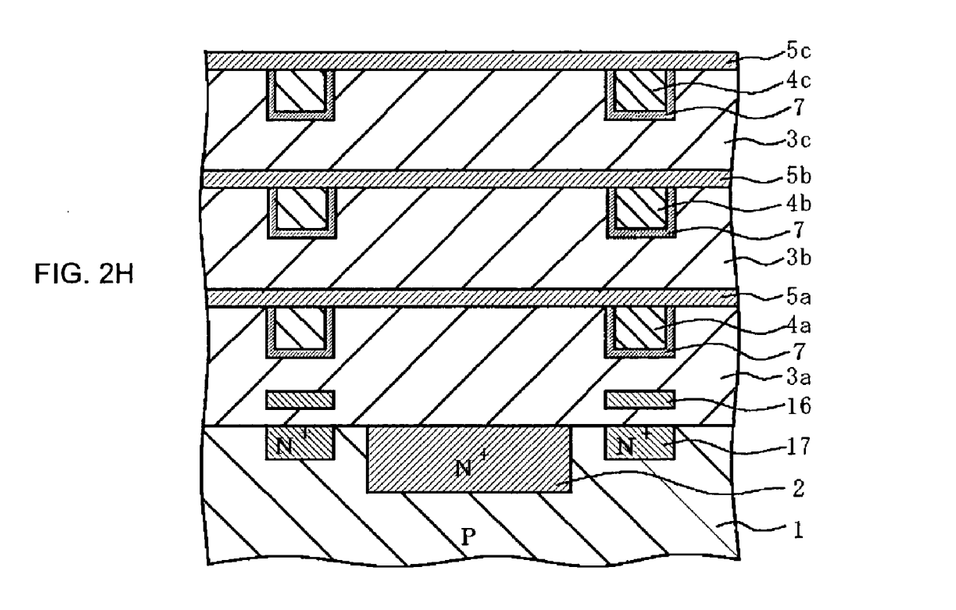

With reference to FIG. 2G, a second interlayer insulating film 3b is formed on the first diffusion-inhibitory film 5a by the procedure shown in FIG. 2B, except that the silicon oxide film 3 and the gate electrode 16 are not formed. A multilayer assemblage shown in FIG. 2H is then formed by repeating the procedures shown in FIGS. 2C, 2D, 2E, and 2F, except that the second and third wirings are formed by a dual damascene process.

Figure 2I:
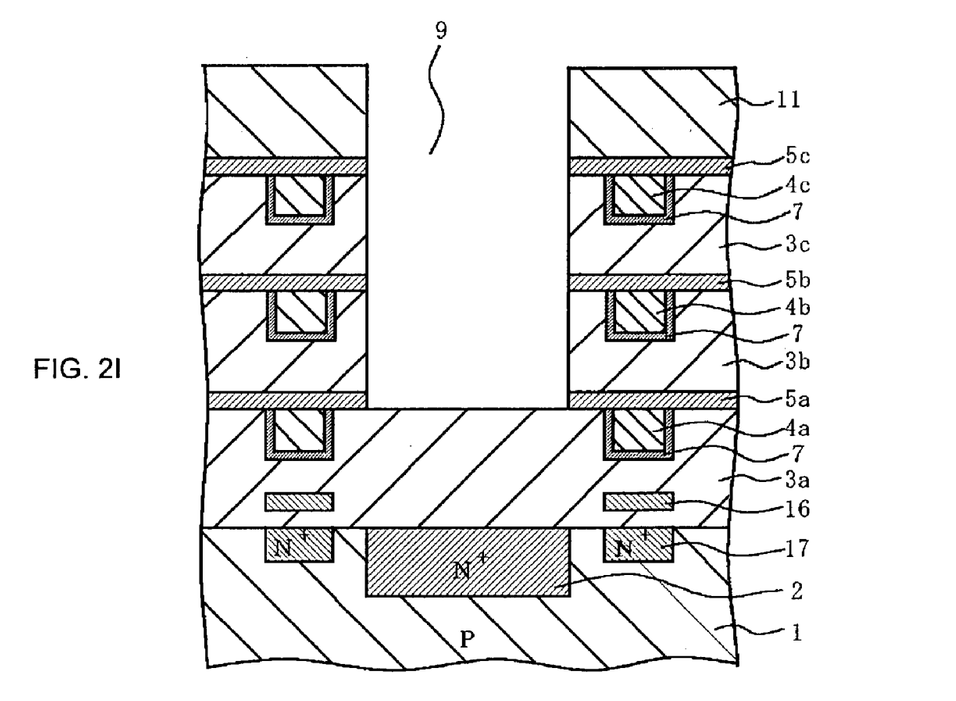

With reference to FIG. 2I, a resist pattern 11 is formed on the multilayer assemblage, and the second and third interlayer insulating films 3b and 3c and the first, second, and third diffusion-inhibitory films 5a, 5b, and 5c above the light receiving unit 2 are removed by etching to thereby form an opening 9.

Figure 2J:
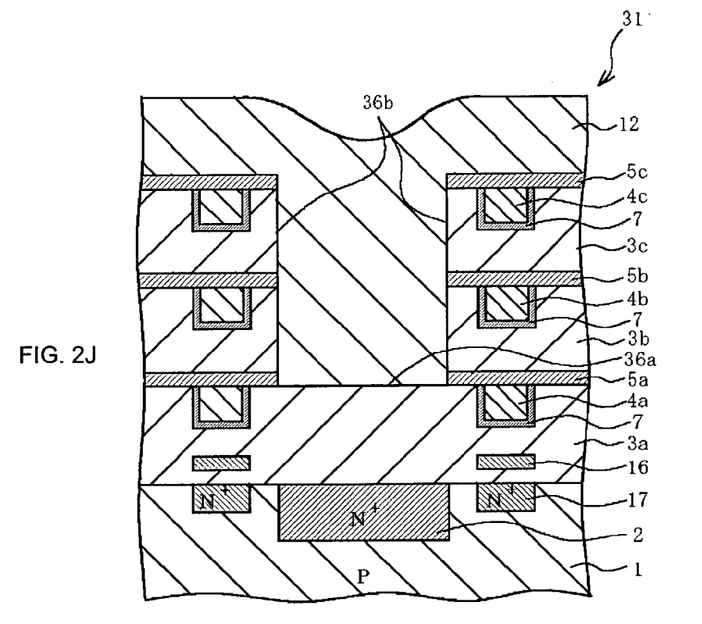

With reference to FIG. 2J, a passivation film 12 serving as a protecting film is formed from silicon nitride. Thus, the opening 9 is filled with silicon nitride. Thereafter, a color filter and an on-chip lens are formed to thereby yield the solid-state imaging device 31 shown in FIG. 1 according to the first embodiment.

In the present embodiment, only the first interlayer insulating film 3a and the passivation film 12 are present in a region above the light receiving unit 2. Although the incident light 13 is partially reflected at an interface between the passivation film 12 and the first interlayer insulating film 3a, it efficiently passes through the passivation film 12 and the first interlayer insulating film 3a and comes into the light receiving unit 2 with less decay in light quantity, since there is no other interface in the region. Accordingly, the light receiving unit 2 can receive a sufficient quantity of the incident light 13.

Second Embodiment

Figure 3:
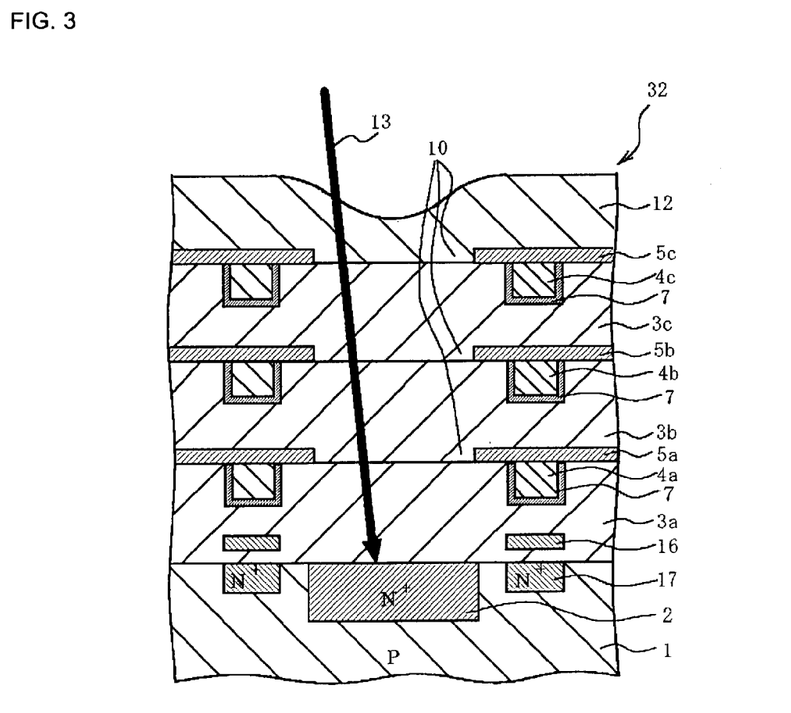
FIG. 3 is a schematic sectional view of a principal part of a solid-state imaging device according to a second embodiment of the present invention.

FIG. 3 is a schematic sectional view of a solid-state imaging device 32 according to a second embodiment of the present invention. The solid-state imaging device 32 is for use in the first solid-state imaging apparatus of the present invention. In this device, diffusion-inhibitory films 5a, 5b, and 5c are removed and thereby are absent in a region above a light receiving unit 2.

More specifically, first, second, and third interlayer insulating films 3a, 3b, and 3c and first, second, and third wirings 4a, 4b, and 4c are formed in the same manner as in the first embodiment, but each the first, second, and third diffusion-inhibitory films 5a, 5b, and 5c in a region above the light receiving unit 2 is selectively removed after they are formed on the interlayer insulating films 3a, 3b, and 3c, respectively.

The diffusion-inhibitory films 5a, 5b, and 5c are thereby absent in the region above the light receiving unit 2, and a region between the surface of the passivation film 12 and the light receiving unit 2 constitutes an incident region with less interfaces between different insulating films. As a result, incident light 13 can efficiently come from the passivation film 12 into the third interlayer insulating film 3c with less reflection at less reflecting interfaces and passes through the second and first interlayer insulating films 3b and 3a comprising the same material as the third interlayer insulating film 3c. Thus, the light receiving unit 2 can receive a sufficient quantity of the incident light 13.

As in the first embodiment, the incident light 13 passes through the passivation film 12 and efficiently comes into the light receiving unit 2, although it is partially reflected at an interface between the passivation film 12 and the third interlayer insulating film 3c. A sufficient quantity of the incident light is photoelectrically converted in the light receiving unit 2, and a circuit arranged on the periphery of the light receiving unit 2 outputs a signal of the input light. The circuit has a transfer unit, an amplifier, and other components.

FIGS. 4A through 4D are schematic diagrams of a manufacturing process for the solid-state imaging device 32.

The initial procedures of the manufacturing process are similar to those of the first embodiment. Specifically, an article shown in FIG. 4A according to the second embodiment is formed by the procedures shown in FIGS. 2A, 2B, 2C, 2D, 2E, and 2F in the first embodiment.

Figure 4A:
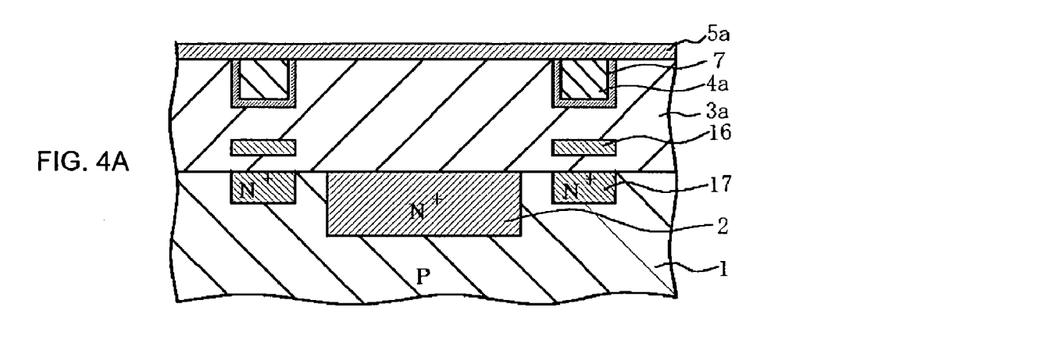
FIGS. 4A through 4D are schematic sectional views of a manufacturing process for the solid-state imaging device according to the second embodiment.
Figure 4B:
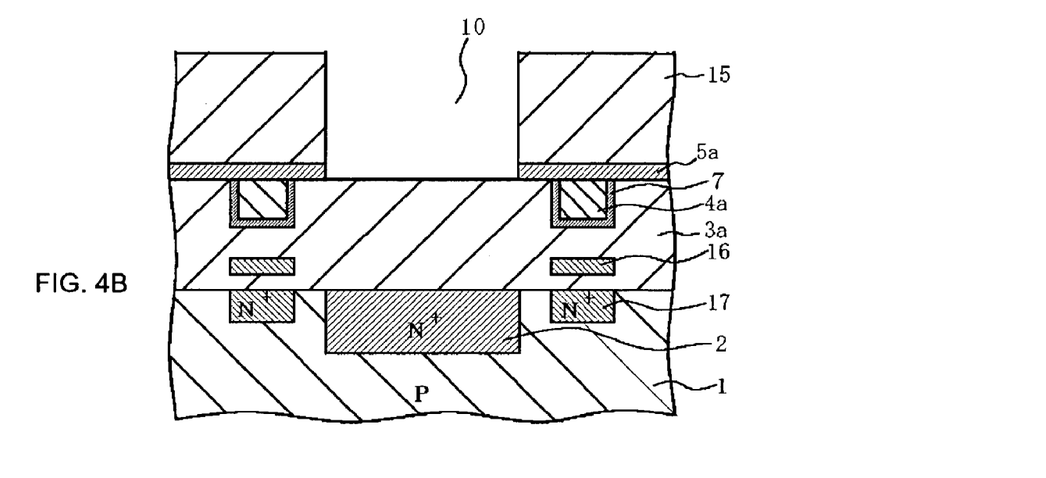

Next, with reference to FIG. 4B, a resist pattern is formed on a first diffusion-inhibitory film 5a, and the first diffusion-inhibitory film 5a in a region above a light receiving unit 2 is removed by etching.

Figure 4C:
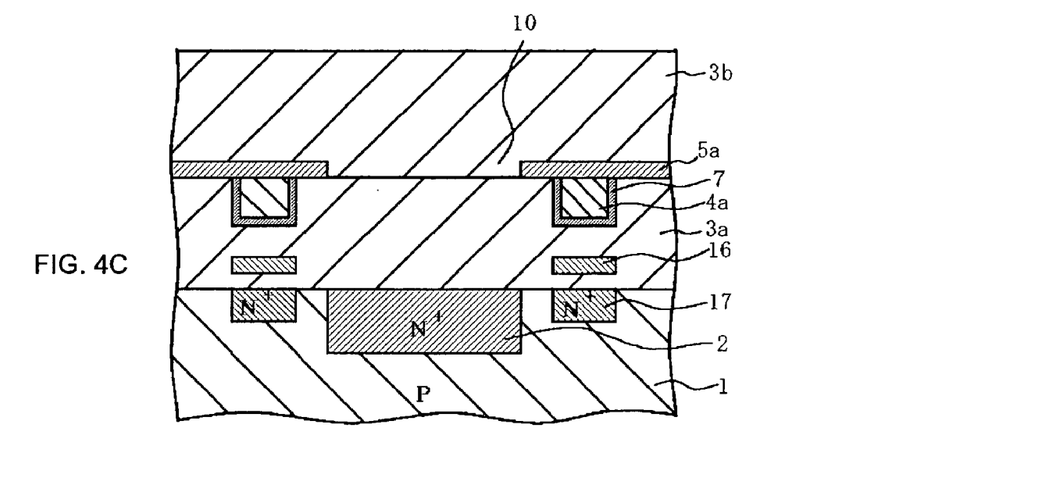
Figure 4D:
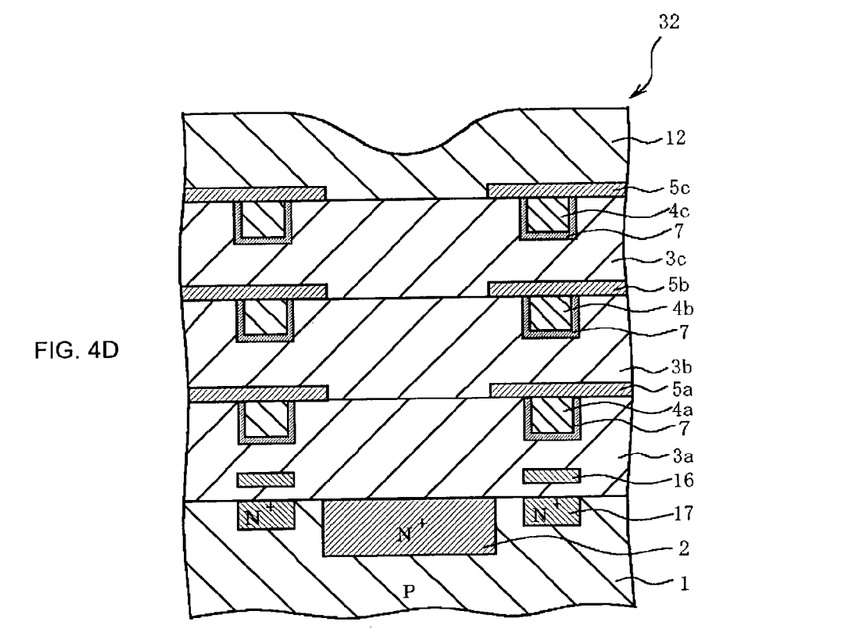

With reference to FIG. 4C, a second interlayer insulating film 3b is formed on the first interlayer insulating film 3a including the remained first diffusion-inhibitory film 5a. Thereafter, the procedures shown in FIGS. 2C, 2D, 2E, and 2F in the first embodiment and procedures shown in FIGS. 4B and 4C in the second embodiment are repeated, the surface of the resulting article is covered with a passivation film 12 and thereby yields a multilayer assemblage shown in FIG. 4D having the same configuration as shown in FIG. 3. Then, a color filter and an on-chip lens are formed to thereby yield the solid-state imaging device 32 according to the second embodiment shown in FIG. 3.

According to the second embodiment, only the passivation film 12 and the first, second, and third interlayer insulating films 3a, 3b, and 3c are present in a region above the light receiving unit 2. Although the incident light 13 is partially reflected at an interface between the passivation film 12 and the third interlayer insulating film 3c, it efficiently passes through the passivation film 12 and the first, second, and third interlayer insulating films 3a, 3b, and 3c and comes into the light receiving unit 2 with less decay in light quantity, since there is no other reflecting interface in the region. Accordingly, the light receiving unit 2 can receive a sufficient quantity of the incident light 13.

Third Embodiment

Figure 5:
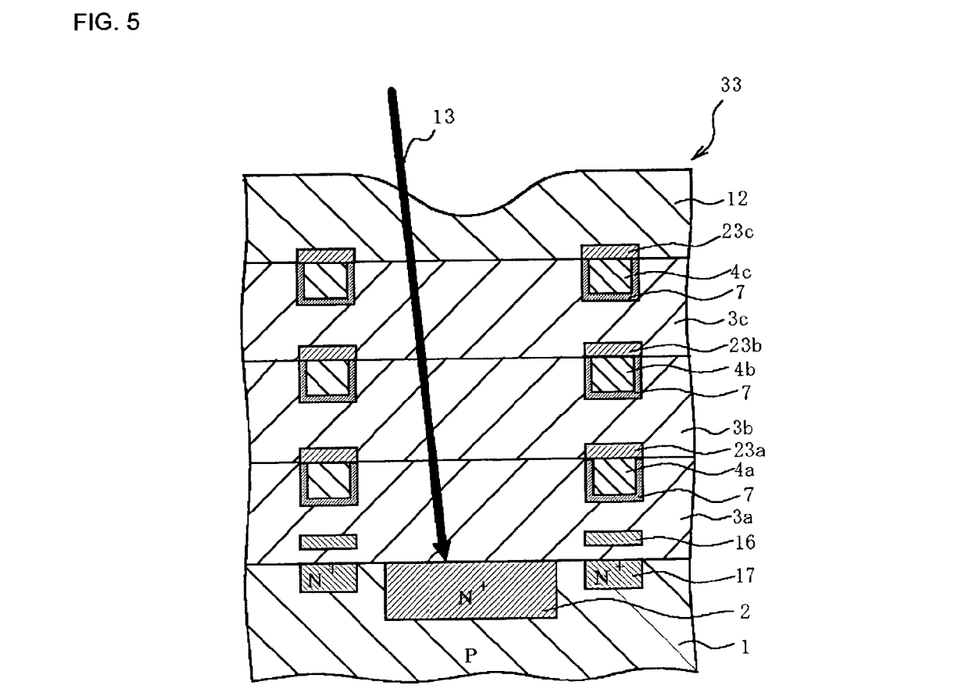
FIG. 5 is a schematic sectional view of a principal part of a solid-state imaging device according to a third embodiment of the present invention.

FIG. 5 is a schematic sectional view of a solid-state imaging device 33 according to a third embodiment of the present invention. This device is for use in the first solid-state imaging apparatus of the present invention. In this device, diffusion-inhibitory films 23a, 23b, and 23c for inhibiting the diffusion of copper are formed only on top surfaces of copper wirings 4a, 4b, and 4c and are completely absent in a region above a light receiving unit 2.

Specifically, first, second, and third interlayer insulating films 3a, 3b, and 3c, and the first, second, and third wirings 4a, 4b, and 4c are formed in the same manner as in the first embodiment, but the first, second, and third diffusion-inhibitory films 23a, 23b, and 23c are formed only on the top surfaces of the first, second, and third wirings 4a, 4b, and 4c.

Thus, the diffusion-inhibitory films 23a, 23b, and 23c are completely absent in the region above the light receiving unit 2, and a region between the surface of the passivation film 12 and the light receiving unit 2 constitutes an incident region with further less interfaces between different insulating films and with further less reflecting points than the first and second embodiments. The incident light 13 thereby highly efficiently comes from the passivation film 12 into the third interlayer insulating film 3c, passes through the second and first interlayer insulating films 3b and 3a comprising the same material as the third interlayer insulating film and comes into the light receiving unit 2. The light receiving unit 2 can thereby receive a further sufficient quantity of the incident light 13.

As in the first embodiment, the incident light 13 passes through the passivation film 12 and efficiently comes into the light receiving unit 2, although it is partially reflected at an interface between the passivation film 12 and the third interlayer insulating film 3c. A sufficient quantity of the incident light is photoelectrically converted in the light receiving unit 2, and a circuit arranged on the periphery of the light receiving unit 2 outputs a signal of the input light. The circuit has a transfer unit, an amplifier, and other components.

FIGS. 6A, 6B, 6C, and 6D are schematic diagrams showing a manufacturing process for the solid-state imaging device 33.

The initial procedures of the manufacturing process are similar to those of the first embodiment. Specifically, an article shown in FIG. 6A according to the third embodiment is formed by the procedures shown in FIGS. 2A, 2B, 2C, 2D, and 2E, in the first embodiment.

Figure 6A:
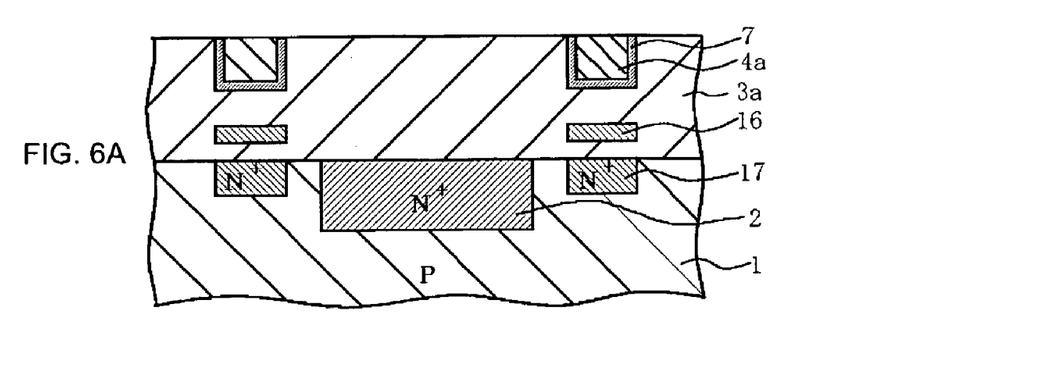
FIGS. 6A through 6D are schematic sectional views of a manufacturing process for the solid-state imaging device according to the third embodiment.
Figure 6B:
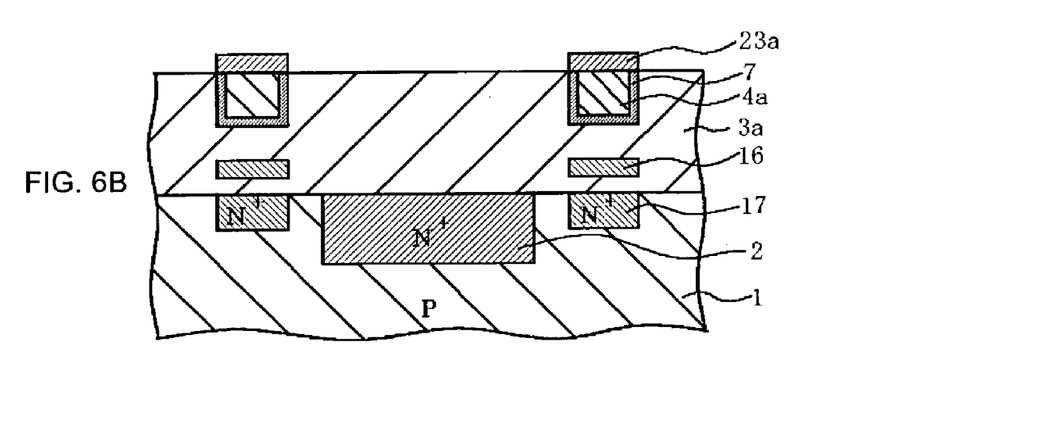

With reference to FIG. 6B, to selectively form a diffusion-inhibitory film on a copper wiring, a film of CoWP (cobalt-tungsten-phosphorus) as a diffusion-inhibitory film is formed only on the top surface of a first wiring 4a. The diffusion-inhibitory film can also be formed from silicon nitride.

By using CoMP, the diffusion-inhibitory film can have a lower dielectric constant to thereby reduce power consumption than the use of the silicon nitride film having a higher dielectric constant. Thus, the resulting device can be driven at a low voltage, since its transfer speed and operation speed do not decrease even at a low power.

Figure 6C:
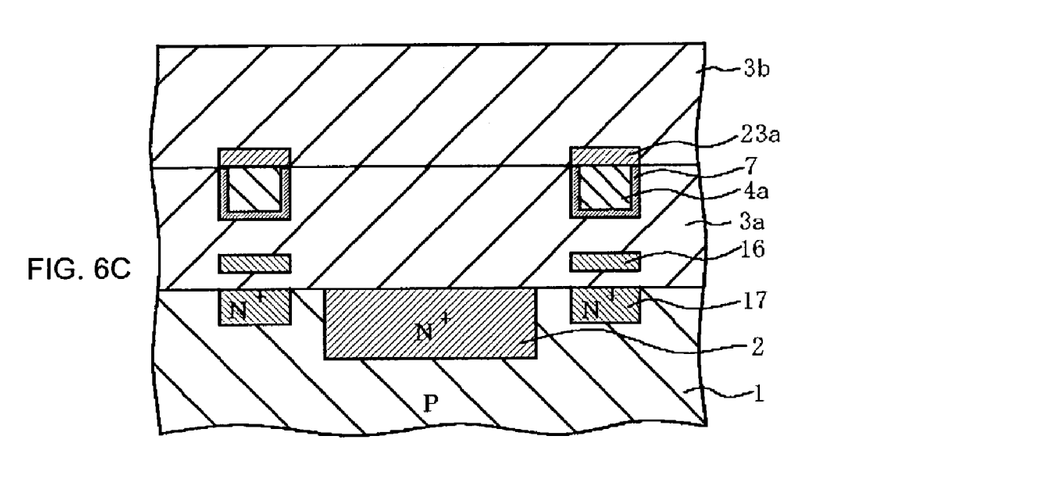
Figure 6D:
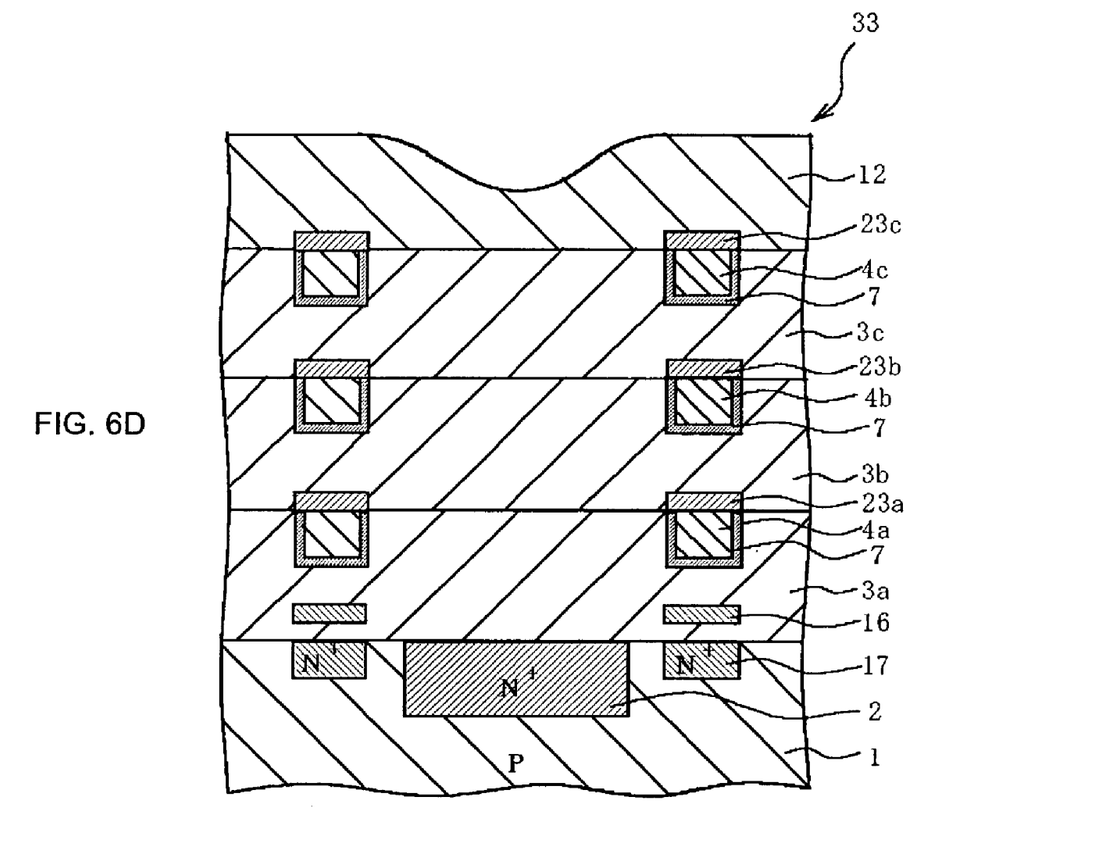

With reference to FIG. 6C, a second interlayer insulating film 3b is formed on the first interlayer insulating film 3a including the diffusion-inhibitory film 23a. Thereafter, the procedures shown in FIGS. 2C, 2D, and 2E in the first embodiment and the procedures shown in FIGS. 6B and 6C in the third embodiment are repeated, the surface of the resulting article is covered with a passivation film 12 and thereby yields a multilayer assemblage of FIG. 6D having the same configuration as in FIG. 5. Then, a color filter and an on-chip lens are formed to thereby yield the solid-state imaging device 33 shown in FIG. 5 according to the third embodiment.

According to the third embodiment, the diffusion-inhibitory film 23a, 23b, and 23c are completely absent, and the only the passivation film 12 and the first, second, and third interlayer insulating films 3a, 3b, and 3c are present in the region above the light receiving unit 2. Although the incident light 13 is partially reflected at an interface between the passivation film 12 and the third interlayer insulating film 3c, it efficiently passes through the passivation film 12 and the first, second, and third interlayer insulating films 3a, 3b, and 3c and comes into the light receiving unit 2 with less decay in light quantity, since there is no other reflecting interface in the region. Accordingly, the light receiving unit 2 can receive a sufficient quantity of the incident light 13.

Fourth Embodiment

Figure 7:
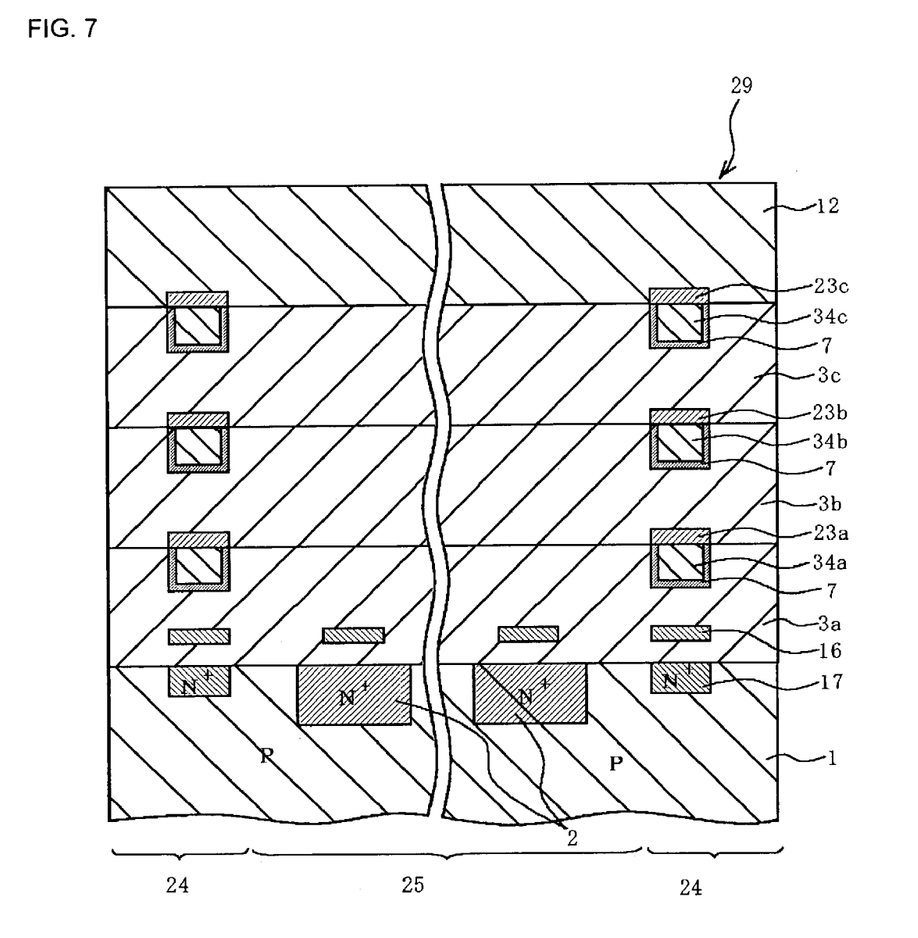
FIG. 7 is a schematic sectional view of a principal part of a solid-state imaging apparatus according to a fourth embodiment of the present invention, corresponding to a sectional view taken along the lines XII—XII in FIG. 9.

FIG. 7 is a schematic sectional view of a solid-state imaging apparatus (second solid-state imaging apparatus) 29 according to a fourth embodiment of the present invention. This figure corresponds to a section taken along with the lines XII—XII in FIG. 9.

A device unit 25 may have any of the configurations shown in the first, second and third embodiments in combination with, if any, other configurations. In any case, a diffusion-inhibitory film for inhibiting a wiring material is arranged in a region other than a region above a light receiving unit. A peripheral circuit unit 24 arranged on the periphery of the device unit 25 has the configuration of the solid-state imaging device according to the third embodiment. Specifically, diffusion-inhibitory films 23a, 23b, and 23c made of a tungsten-phosphorus material are arranged only on the top surfaces of wirings 34a, 34b, and 34c in the peripheral circuit unit 24.

In the device unit 25, diffusion-inhibitory films are absent in a region above the light receiving unit 2, incident light can thereby efficiently come into the light receiving unit 2, and the light receiving unit 2 can receive a sufficient quantity of the incident light, as in the embodiments mentioned above. In addition, the wirings 34a, 34b, and 34c in the peripheral circuit unit 24 are formed from copper having a low resistance, and a driving circuit can be operated at a high speed. The copper wirings capable of reducing their size also contribute a higher density wiring and/or a reduced size of the apparatus.

The diffusion-inhibitory films 23a, 23b, and 23c arranged on the wirings 34a, 34b, and 34c of the peripheral circuit unit 24 shown in FIG. 7 have the configuration of the third embodiment. The wiring configuration according to the first or second embodiment can also be employed, but the configuration of the third embodiment, i.e., diffusion-inhibitory films made of a tungsten-phosphorus (WP) material as shown in FIG. 7, are more effective.

In comparison with diffusion-inhibitory films made of silicon nitride having a large dielectric constant, the diffusion-inhibitory films made of a tungsten-phosphorus (WP) material according to the wiring configuration shown in FIG. 7 have a lower dielectric constant to thereby achieve a reduced power consumption. In addition, a driving circuit can be operated at a high speed at a low voltage.

According to the fourth embodiment, diffusion-inhibitory films are absent in the region above the light receiving unit 2 of the device unit 25, the incident light can thereby efficiently comes into the light receiving unit 2, and the light receiving unit 2 can receive a sufficient quantity of the incident light. In addition, by arranging the wiring having a damascene structure and the diffusion-inhibitory films 23a, 23b, and 23c made of a tungsten-phosphorus material in the peripheral circuit unit 24 of the solid-state imaging apparatus 29, a low-resistance wiring can be formed in the peripheral circuit, and a driving circuit can be operated at a high speed at a low voltage. In addition, by using the copper wiring, the resulting wiring can have a higher density, and the apparatus can be downsized.

The aforementioned embodiments can be modified based on the technical concept of the present invention.

For example, the embodiments have been illustrated by taking a two-dimensional CCD having vertical and horizontal transfer units as an example, but they can also be applied to a one-dimensional CCD having a transfer unit in one direction.

In the first solid-state imaging apparatus in the embodiments, the solid-state imaging device including the light receiving unit 2 has a damascene-structure wiring. In the second solid-state imaging apparatus, the peripheral circuit unit has a damascene-structure wiring. However, both the solid-state imaging device and the peripheral circuit unit can each have a damascene structure.

The device and apparatus can also be applied to complementary metal oxide semiconductor (CMOS) image sensors in addition to CCDs. In this case, the damascene structure can improve performances of the CMOS image sensors, such as high-speed operation.

The structures, shapes, sizes, and materials of individual components in the embodiments are not specifically limited to those described in the embodiments and can be appropriately modified.

I claim:

1. A solid-state imaging device comprising:
a light receiving unit formed on a substrate;
a charge transfer unit adjacent to the light receiving unit;
an interlayer insulating film formed above the substrate and a;
formed on or above said interlayer insulating film in a region horizontally offset from said light receiving unit; and
a diffusion-inhibitory film formed having a portion over said wiring and having a portion extending over a surface of said interlayer insulating film adjacent said wiring, the film serving for inhibiting the diffusion of a wiring material,
wherein there is at least substantially no diffusion-inhibitory film in a region on or directly above a light receiving surface of said light receiving unit.

2. The solid-state imaging device according to claim 1, wherein the diffusion-inhibitory film is arranged only in a region above the wiring.

3. The solid-state imaging device according to claim 1, further comprising a surface protecting film formed at least above the light receiving unit.

4. The solid-state imaging device according to claim 1, further comprising a plurality of the interlayer insulating film, wiring, and diffusion-inhibitory films.

5. The solid-state imaging device according to claim 1, wherein the wiring comprises copper or an alloy thereof, and wherein the diffusion-inhibitory film comprises at least one of silicon nitride, silicon carbide, and a tungsten-phosphorus material.

6. The solid-state imaging device according to claim 1 further comprising a recess formed in said insulating layer, wherein the a barrier layer for the wiring material is also arranged on bottom and side surfaces of the recess.

7. The solid-state imaging device according to claim 6, wherein the wiring comprises copper or an alloy thereof, and wherein the diffusion-inhibitory film in the recess comprises at least one of tantalum and tantalum nitride.

8. A solid-state imaging apparatus, comprising:
a light receiving unit formed on a substrate and a charge transfer unit arranged adjacent to the light receiving unit;
a peripheral circuit arranged at a peripheral part of the solid-state imaging apparatus;
an interlayer insulating film formed above the substrate;
a wiring arranged at the periphery of the solid-state imaging apparatus; and
a diffusion-inhibitory film having a portion over the wiring and having a portion positioned over a surface of said interlayer insulating film, and inhibiting the diffusion of wiring material, the diffusion-inhibitory film being arranged such that there is at least substantially no diffusion-inhibitory film in a region on or directly above a light receiving surface of said light receiving unit.

9. A solid-state imaging apparatus having a light receiving unit and a peripheral circuit formed on a substrate, comprising:
an interlayer insulating film formed above the substrate;
one or more wirings formed on or above the interlayer insulating film;
a diffusion-inhibitory film formed over the wirings and over the insulating film;
wherein the diffusion-inhibitory film is not present directly above a light receiving surface of said light-receiving unit.

10. The solid-state imaging apparatus according to claim 9, wherein the diffusion-inhibitory film is formed above the peripheral circuit.

11. The solid-state imaging apparatus according to claim 9, wherein the diffusion-inhibitory film is formed only above the wirings.

12. The solid-state imaging apparatus according to claim 9, wherein the wiring is embedded in a recess formed in the interlayer insulating film.

13. The solid-state imaging apparatus according to claim 9, further comprising a barrier layer formed in the recess between the wiring and the interlayer insulating film.

14. The solid-state imaging apparatus according to claim 9, wherein the wiring is formed of copper, and wherein the diffusion-inhibitory film is comprised of silicon-nitride or tungsten-phosphorus.

15. The solid-state imaging apparatus according to claim 13, wherein the barrier layer includes tantalum.

16. The solid-state imaging apparatus according to claim 9, wherein the imaging apparatus is comprised of a plurality of interlayer insulating film layers, wirings and diffusion-inhibitory films.

17. The solid-state imaging apparatus according to claim 9, wherein the interlayer insulating film is at least substantially removed above a light receiving surface of the light receiving unit.

18. The solid-state imaging device according to claim 1, wherein said interlayer insulating film is formed in a contiguous fashion from under said wiring to directly above the light receiving surface of said light receiving unit.

* * * * *